(12) United States Patent
Mohammad (10) Patent No.: US 9,007,799 B2
(45) Date of Patent: Apr. 14, 2015

(54) LOW POWER CONTENT ADDRESSABLE MEMORY SYSTEM

(75) Inventor: Khader Mohammad, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/977,524

(22) PCT Filed: Apr. 25, 2012

(86) PCT No.: PCT/US2012/034898
§ 371 (c)(1),
(2), (4) Date: Jun. 28, 2013

(87) PCT Pub. No.: WO2013/162533
PCT Pub. Date: Oct. 31, 2013

(65) Prior Publication Data
US 2014/0192580 A1    Jul. 10, 2014

(51) Int. Cl.
*G11C 15/00* (2006.01)
*G11C 15/04* (2006.01)

(52) U.S. Cl.
CPC ................ *G11C 15/00* (2013.01); *G11C 15/04* (2013.01)

(58) Field of Classification Search
CPC ................................ G11C 15/00; G11C 15/04
USPC .................... 365/49.17, 49.11, 49.15
See application file for complete search history.

(56) References Cited

U.S. PATENT DOCUMENTS

| | | | |
|---|---|---|---|
| 6,125,049 A * | 9/2000 | Nataraj ............... | 365/49.15 |
| 6,436,399 B1 * | 8/2002 | Rikihisa et al. ........... | 424/139.1 |
| 6,539,455 B1 * | 3/2003 | Khanna et al. ............. | 711/108 |
| 6,549,042 B2 * | 4/2003 | Proebsting ............... | 327/51 |
| 6,760,242 B1 * | 7/2004 | Park et al. .................. | 365/49.15 |
| 6,786,659 B1 * | 9/2004 | Katayama et al. ............. | 400/62 |
| 6,845,025 B1 * | 1/2005 | Nataraj ........................ | 365/49.1 |
| 6,867,989 B1 | 3/2005 | Roy | |
| 7,016,211 B2 * | 3/2006 | Park et al. .................. | 365/49.12 |

(Continued)

FOREIGN PATENT DOCUMENTS

WO        2013/162533 A1    10/2013

OTHER PUBLICATIONS

Beamer et al. "Design of a Low Power Content Addressable Memory (CAM)", Department of Electrical Engineering & Computer Science University of California, Berkeley, May 7, 2009, 6 pages.

(Continued)

*Primary Examiner* — Viet Q Nguyen
(74) *Attorney, Agent, or Firm* — Garrett IP, LLC (57) ABSTRACT

A content addressable memory (CAM) system includes one or more CAM cells, each including a bit cell to store a bit and a complementary bit, and a compare circuit to compare a reference input to the stored bit and to the stored complementary bit. The compare circuit may be implemented to compare a single-ended reference input to each of the stored bit and the complementary bit. The compare circuit may include a pass circuit to selectively provide the reference input to an output under control of the stored bit and the stored complementary bit, a pull-up circuit to selectively pull-up the output under control of the reference input and the stored complementary bit, and a pull-down circuit to selectively pull-down the output under control of the reference input and the stored bit. The reference input may be provided to multiple CAM cells, which may share compare circuitry.

14 Claims, 5 Drawing Sheets

(56) References Cited

U.S. PATENT DOCUMENTS

| | | | |
|---|---|---|---|
| 7,126,834 B1* | 10/2006 | Meng et al. | 365/49.11 |
| 7,298,635 B1 | 11/2007 | Maheshwari | |
| 7,907,432 B2* | 3/2011 | Deshpande et al. | 365/49.1 |
| 8,023,301 B1* | 9/2011 | Srinivasan et al. | 365/49.18 |
| 8,315,078 B2* | 11/2012 | Burda et al. | 365/49.1 |
| 8,451,640 B2* | 5/2013 | Gronlund et al. | 365/49.17 |
| 2004/0170041 A1 | 9/2004 | Huang | |
| 2007/0014139 A1 | 1/2007 | Perry et al. | |

OTHER PUBLICATIONS

Miyatake et al. "A Design for High-Speed Low-Power CMOS Fully Parallel Content-Addressable Memory Macros", IEEE Journal of Solid-State Circuits, vol. 36, No. 6, Jun. 2001 pp. 956-968.

Pagiamtzis et al. "Content-Addressable Memory (CAM) Circuits and Architectures: A Tutorial and Survey", IEEE Journal of Solid-State Circuits, vol. 41, No. 3. Mar. 2006. 16 pages.

International Search Report and Written Opinion received for International Application No. PCT/US2012/034898, mailed Nov. 28, 2012, 8 pages.

Office Action of Chinese Patent Application No. 201320213329.7; Mailed Aug. 23, 2013; 4 pages including 2 pages of English translation.

Office Action received for Chinese Patent Application No. 201320213329.7, mailed on Nov. 7, 2013, 4 Pages of Office Action including 2 pages of English Translation.

Notice of Grant received for Chinese Patent Application No. 201320213329.7, mailed on Jan. 29, 2014, 3 pages of NOA including 1 page of English Translation.

International Preliminary Report on Patentability and Written Opinion received for PCT Patent Application No. PCT/US2012/034898, mailed on Nov. 6, 2014, 5 pages.

\* cited by examiner

LOW POWER CONTENT ADDRESSABLE MEMORY SYSTEM

BACKGROUND

In a random access memory (RAM) system, a memory address and read controls are applied to the RAM system to retrieve or read contents of the memory address.

In a content addressable memory (CAM) system, a data word is provided to the CAM system, and a search for the data word is performed across bits cells of the CAM. If the data word is found, the CAM system indicates a match and returns a list of one or more storage addresses where the word was found. The CAM system may also return the data word or other associated information. A CAM system may be viewed as a hardware embodiment of a software-based associative array.

A CAM system may include an array of CAM cells, each including a storage or bit cell and a compare circuit to compare contents of the bit cell with a reference bit. Conventional CAM compare circuits are implemented with complementary or differential reference bit lines, which increase routing complexity and space requirements. The compare circuits may include a separate pass circuit for each of the differential reference bit lines. Switching delays in the CAM cell can cause unwanted current contention between the separate pass circuits, which manifests itself as a crowbar current that wastes power and slows down CAM speed.

BRIEF DESCRIPTION OF THE DRAWINGS/FIGURES

In the drawings, the leftmost digit(s) of a reference number identifies the drawing in which the reference number first appears.

DETAILED DESCRIPTION

Figure 1:
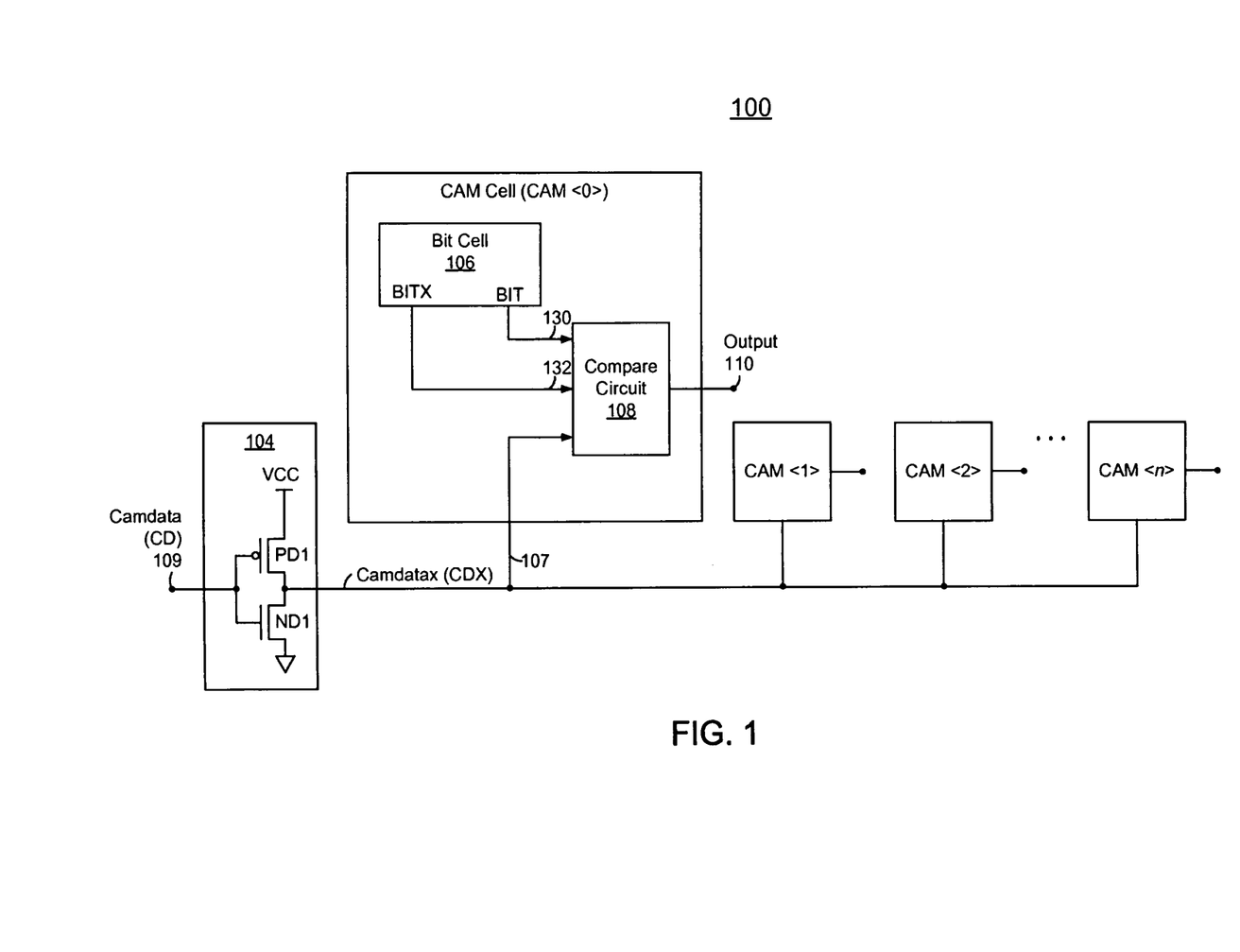
FIG. 1 is a circuit diagram of a content addressable memory (CAM) system, including multiple CAM cells and a driver circuit to provide a reference input to each of the CAM cells, where each CAM cell includes a bit cell and a compare circuit.

FIG. 1 is a block diagram of a content addressable (CAM) system 100, including multiple CAM cells <0> through <n>

CAM cell <0> is described below. CAM cells <1> through <n> may be implemented similar to CAM cell <0>.

CAM cell <0> includes a bit cell 106 to store a bit BIT and a corresponding complementary hit BITX at corresponding nodes of bit cell 106.

CAM cell <0> further includes a compare circuit 108 to compare a reference input 107 to the stored bit (BIT) and to the stored complementary bit (BITX), and to provide an indication at an output 110 based on the comparison.

CAM system 100 may include a driver circuit 104 to provide reference input 107 to CAM cells <0> through <n>. In the example of FIG. 1, driver circuit 104 is illustrated as an inverter to receive a reference bit 109, illustrated here as Camdata (CD), and to provide a corresponding inverted reference bit, Camdatax (CDX), as reference input 107.

Compare circuit 108 may include logic to compare CDX to BIT and to BITX, and to output a match indication at output 110 when CDX differs from BIT and matches BITX, which is equivalent to CD matching BIT and differing from BITX.

Alternatively, reference bit CD may be provided directly to reference input 107, and compare circuit 108 may include logic to compare CD to BIT and to BITX, and to output a match indication at output 110 when CD matches BIT and differs from BITX.

In the example of FIG. 1, compare circuit 108 includes complementary inputs 130 and 132, also referred to herein as differential inputs, to receive BIT and BITX.

Reference input 107 may include a differential input or a single-ended input.

Compare circuit 108 may include logic to perform one of the following based on logic states of reference input 107, BIT, and BITX:

provide reference input 107 to output 110;

pull-up output 110; and pull-down output 110.

The term pull-up, as used herein, refers to a switch device and/or circuit to couple a node to an operating voltage, Vcc. The term pull-down, as used herein, refers to a switch device and/or circuit to couple a node to a voltage reference, Vss, which may correspond to ground.

For illustrative purposes, a logic state of 1 corresponds to Vcc, and a logic state of 0 corresponds to Vss. Methods and systems disclosed herein are not, however, limited to these relative examples.

Compare circuit 108 may be implemented to perform an XOR operation with respect to reference input 107, BIT, and BITX.

Figure 2:
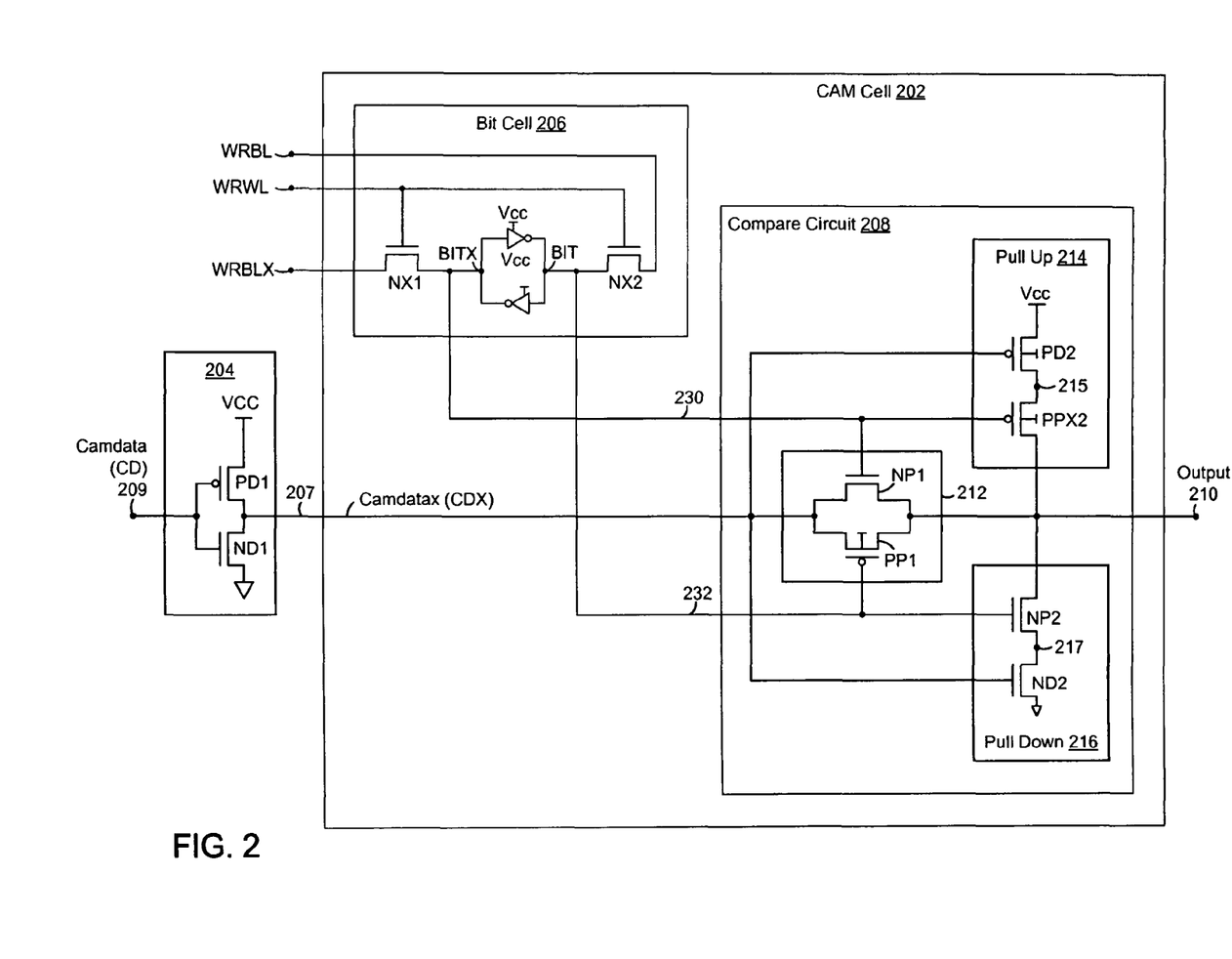
FIG. 2 is a circuit diagram of CAM cell and a driver circuit.

FIG. 2 is a circuit diagram of a CAM cell 202 and a driver circuit 204, which may represent CAM cell <0> and driver circuit 104 of FIG. 1.

CAM cell 202 includes a bit cell 206 and a compare circuit 208, which may represent embodiments of bit cell 106 and compare circuit 108 of FIG. 1.

Bit cell 206 is illustrated as a contention-based bit cell having cross-coupled inverters to store BIT and BITX, and dual write gates NX1 and NX2, controllable by a write word-line WRWL, to write values from write bit lines WRBL and WRBLX to corresponding nodes of the cross-coupled inverters.

Compare circuit 208 includes:

a pass circuit 212 to selectively provide a reference input 207 to an output 210 under control of BIT and BITX;

a pull-up circuit 214 to selectively pull-up output 210 under control of reference input 207 and BITX; and a pull-down circuit 216 to selectively pull-down output 210 under control of reference input 207 and BIT.

Pass circuit 212 is described below. Pull-up circuit 214 and pull-down circuit 216 are described further below.

In the example of FIG. 2, pass circuit 212 is on when BIT is at logic state 0 and BITX is at logic state 1. Pass circuit 212 is off when BIT is at logic state 1 and BITX is at logic state 0.

When pass circuit 212 is on, reference input 207 is provided output 210 through pass circuit 212. Specifically, when BIT is at logic state 0 and CDX is at logic state 0 (i.e., CD is at logic state 1), the CDX logic state 0 is provided to output 210 to indicate that CD does not match BIT. Conversely, when CDX is at logic state 1 (i.e., CD is at logic state 0), the CDX logic state 1 is provided to output 210 to indicate that CD matches BIT.

When pass circuit 212 is off, output 210 is driven by one of pull-up 214 and pull down 216.

Pull-up circuit 214 is now described.

Pull-up circuit 214 includes a P-type device PD2 controllable as a switch by reference input 207, and a P-type device PPX2 controllable as a switch by BITX. When reference input 207 is at logic state 0, PD2 turns on to couple a node 215 to Vcc. When BITX is at logic state 0, PPX2 turns on to couple output 210 to node 215. Thus, when CDX and BITX are at logic state 0 (i.e., CD and BIT are at logic state 1), output 210 is pulled-up to Vcc, or logic state 1, to indicate that CD matches BIT.

Pull-down circuit 216 is now described.

Pull-down circuit 216 includes an N-type device ND2 controllable as a switch by reference input 207, and an N-type device NP2 controllable as a switch by BIT. When reference input 207 is at logic state 1, ND2 turns on turns on to couple a node 217 to Vss. When BIT is at logic state 1, NP2 turns on to couple output 210 to node 217. Thus, when CDX and BIT are at logic state 1 (i.e., CD is at logic state 0), output 210 is pulled-down to Vss, or logic state 0, to indicate that CD does not match BIT.

Pull-up circuit 214 and pull-down circuit 216 may be referred to together as an output switch stack.

The above-descriptions of pass gate 212, pull-up circuit 214, and pull-down circuit 216 are summarized in Tables 1 and 2 below.

TABLE 1

| BIT | BITX | Pass Gate |
|---|---|---|
| 1 | 0 | Off |
| 0 | 1 | On |

TABLE 2

| BIT | BITX | CD | CDX | Pass Gate 212 | PD2 | PPX2 | ND2 | NP2 | Output 210 |
|---|---|---|---|---|---|---|---|---|---|
| 1 | 0 | 1 | 0 | Off | On | On | Off | On | 1 |
| 1 | 0 | 0 | 1 | Off | Off | On | On | On | 0 |
| 0 | 1 | 1 | 0 | On | On | Off | Off | Off | 0 (=CAMX) |
| 0 | 1 | 0 | 1 | On | Off | Off | On | Off | 1 (=CAMX) |

The example of FIG. 2 includes a single driver circuit 204, and compare circuit 208 compares reference input 207 to each of BIT and BITX. Compare circuit 208 may thus be referred to as a single-ended reference input embodiment, as opposed to differential reference input embodiment.

A differential reference input embodiment may include a first driver to provide a reference input, a second driver to provide corresponding complementary reference, and a differential-input compare circuit to compare the reference input and the complementary reference input to BIT and BITX.

A single-ended reference input embodiment, as illustrated in FIG. 2, may provide reduced routing complexity, area consumption, line driver power requirements, and/or capacitive switching.

A single driver circuit, such as driver circuit 204, may be implemented with a larger scale fabrication technology (i.e., wider channels, longer channels, and/or larger feature sizes), relative to driver circuits of a differential reference input embodiment, to drive a larger gate load. Nevertheless, a single-ended reference input embodiment may reduce overall area and/or power requirements.

A CAM system may be implemented to provide a reference input to multiple CAM cells, as illustrated in FIG. 1, and may include circuitry that is shared amongst the multiple CAM cells, such as described below with reference to FIG. 3.

Figure 3:
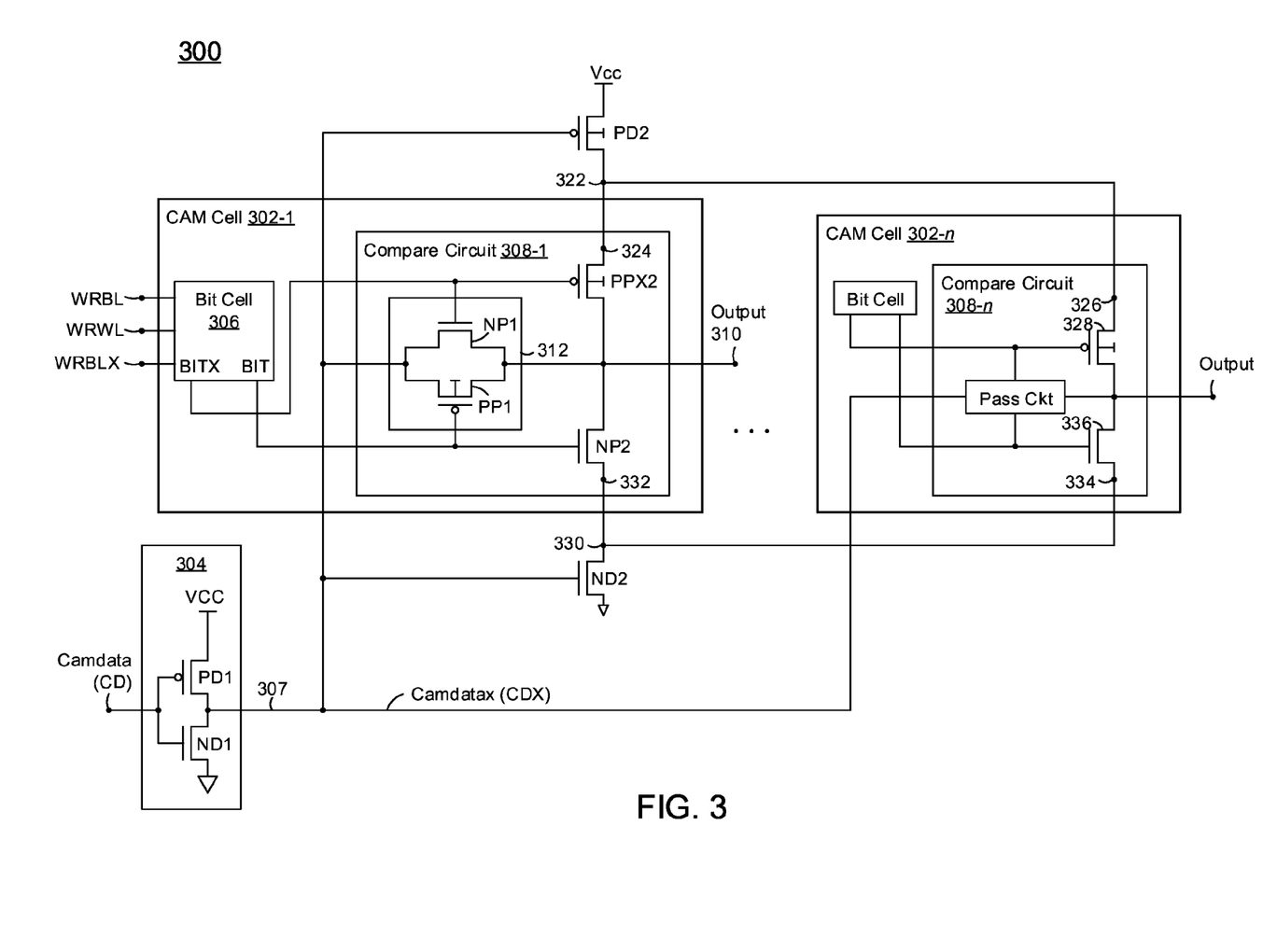
FIG. 3 is a circuit diagram of another CAM system, including multiple CAM cells and a driver circuit to provide a reference input to each of the CAM cells.

FIG. 3 is a circuit diagram of a CAM system 300, including multiple CAM cells 302-1 through 302-n, and a driver circuit 304 to provide a reference input 307 to each of CAM cells 302. CAM cell 302-1 is described below. Remaining ones of CAM cells 302 may be implemented similar to CAM cell 302-1.

CAM cell 302-1 includes a bit cell 306, which may be implemented as described in one or more examples herein.

CAM cell 302-1 further includes a compare circuit 308, including a pass circuit 312 to selectively provide reference input 307 to an output 310 under control of BIT and BITX, such as described above with reference to pass circuit 212 in FIG. 2.

CAM cell 302-1 further includes pull-up circuitry to selectively pull-up output 310 under control of reference input 307 and BITX, and pull-down circuitry to selectively pull-down output 310 under control of reference input 307 and BIT. The pull-up circuitry includes PD2 and PPX2, and the pull-down circuitry includes ND2 and NP2, as described above with reference to FIG. 2.

In FIG. 3, pull-up device PD2 and pull-down device ND2 is shared amongst compare circuits 308-1 through 308-n of CAM cells 302-1 through 302-n. Specifically, device PD2 includes a terminal 322 coupled to a terminal 324 of device PPX2 of compare circuit 308-1, and to a terminal 326 of a corresponding device 328 of compare circuit 308-n. Similarly, device ND2 includes a terminal 330 coupled to a terminal 332 of device NP2 of compare circuit 308-1, and to a terminal 334 of a corresponding device 336 of compare circuit 308-n. Sharing of PD2 and/or ND2 may further reduce area and/or power consumption.

A CAM system as disclosed herein may be implemented to search an array of CAM cells for a reference word that includes multiple reference bits.

Figure 4:
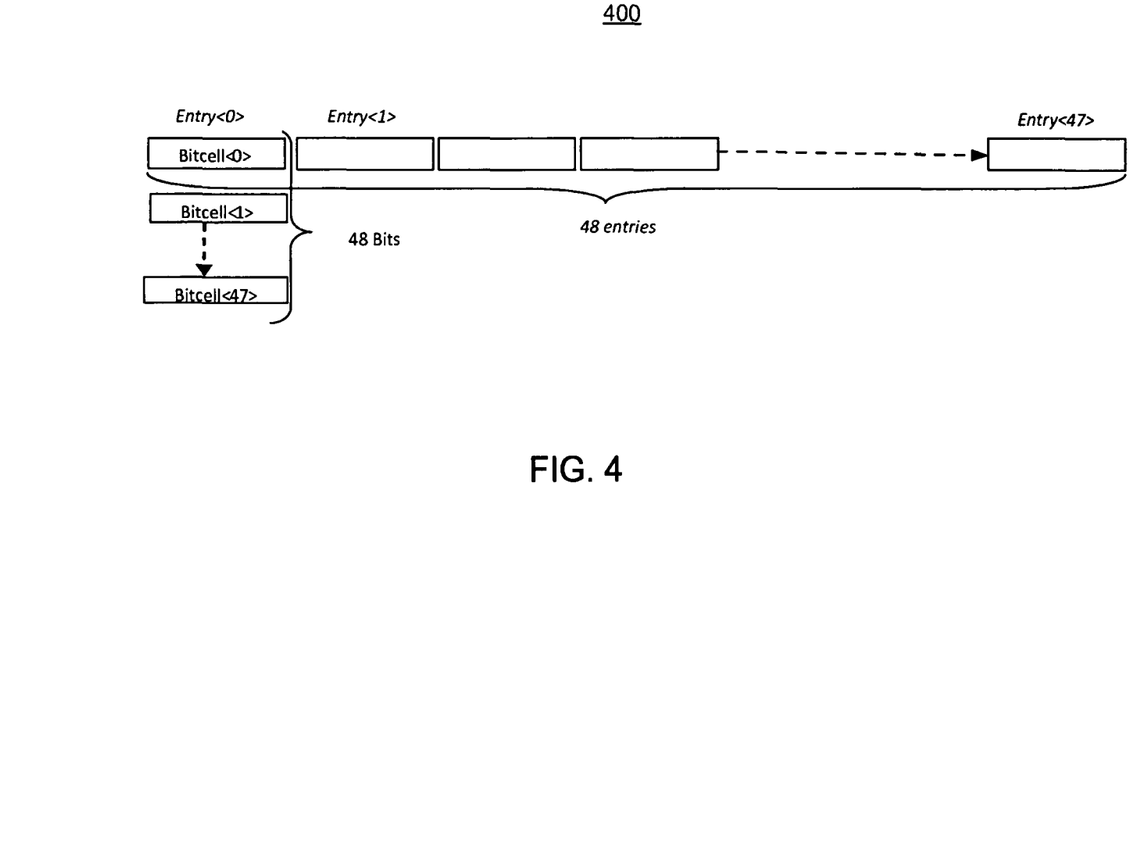
FIG. 4 is a block diagram of an in by in array of CAM cells.

FIG. 4 is a block diagram of an example in by in array 400 of CAM cells, which may be implemented as described in one or more examples herein. Array 400 may be arranged as in rows of m-bit words. Array 400 may represent, for example, a 48×48 array.

Methods and systems disclosed herein may be implemented with respect to one or more of a variety of systems, such as described below with reference to FIG. 5. Methods and systems disclosed herein are not, however, limited to the examples of FIG. 5.

Figure 5:
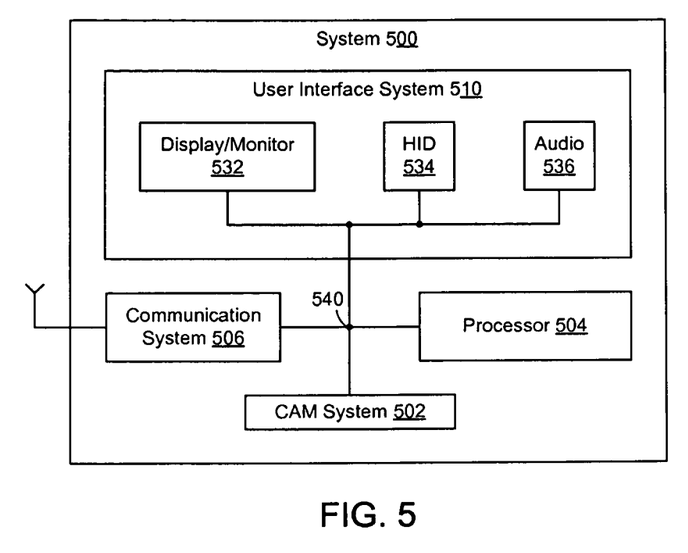
FIG. 5 is a block diagram of a processor-based system, including a CAM system.

FIG. 5 is a block diagram of a system 500 including a CAM system 502, which may be implemented as described in one or more examples herein.

System 500 may further include a processor 504 to access CAM system 502, such as to store data and/or to search for reference words, CAM system 502 may be implemented as part of a memory system to support operation of processor 504, and may represent, for example, a cache or an associative memory. CAM system 502 may be coupled to or integrated within processor 504.

System 500 may include a communication system 506 to interface with a communication network. Communication system 506 may include a wired and/or wireless communication transceiver.

System 500 or portions thereof may be implemented within one or more integrated circuit dies, and may be implemented as a system-on-a-chip (SoC).

System 500 may further include a user interface system 510.

User interface system 510 may include a monitor or display 532 to display information from processor 504 and/or communication system 506.

User interface system 510 may include a human interface device (MD) 534 to provide user input to processor 504 and/or communication system 506. HID 534 may include, for example and without limitation, one or more of a key hoard, a cursor device, a touch-sensitive device, and or a motion and/or image sensor. HID 534 may include a physical device and/or a virtual device, such as a monitor-displayed or virtual keyboard.

User interface system 510 may include an audio system 536 to receive and/or output audible sound.

System 500 may correspond to, for example, a computer system, a personal communication device, and/or a television set-top box.

System 500 may further include communication infrastructure 540 to permit communications amongst CAM system 502, processor 504, communication system 506, and/or user interface system 510.

System 500 may include a housing, and one or more of communication system 506, digital processor system 504 user interface system 510, or portions thereof may be positioned within the housing. The housing may include, without limitation, a rack-mountable housing, a desk-top housing, a lap-top housing, a notebook housing, a net-book housing, a set-top box housing, a portable housing, and/or other conventional electronic housing and/or future-developed housing.

As disclosed herein, a content addressable memory (CAM) apparatus may include a first CAM cell. The first CAM cell may include a first bit cell to store a bit and a corresponding complementary bit. The first CAM cell may further include a first compare circuit to compare a reference input to the stored bit and to the corresponding stored complementary bit, and to provide an indication based on the comparison.

The reference input may include a single-ended reference input, and the first compare circuit may include logic to compare the single-ended reference input to each of the stored bit and the corresponding stored complementary bit.

The first compare circuit may include logic to output a match indication when a reference bit matches the stored bit and differs from corresponding stored complementary bit. The CAM apparatus may include an inverter to invert the reference bit and to provide the inverted reference bit as the input reference, and the first compare circuit may include logic to output a match indication when the inverted reference bit differs from the stored bit and matches the corresponding stored complementary bit.

The first compare circuit may include logic to perform one of the following based on logic states of the reference input, the stored bit, and the stored complementary bit:
provide the reference input to an output;
pull-up the output; and
pull-down the output,
The first compare circuit may include:
a pass circuit to selectively provide the reference input to an output under control of the stored bit and the stored complementary bit;
a pull-up circuit to selectively pull-up the output under control of the reference input and the stored complementary bit; and
a pull-down circuit to selectively pull-down the output under control of the reference input and the stored bit.

As further disclosed herein, the CAM apparatus may include a second CAM cell, including a second bit cell and a second compare circuit to receive the same reference input as the first CAM cell, and to compare the reference input to a bit and complementary bit stored in the second bit cell.

The first and second compare circuits may include corresponding first and second pull-up circuits. The first and second pull-up circuits may each include a corresponding first switch device controllable by the respective stored complementary bit. The first and second pull-up circuits may further include a shared second switch device controllable by the reference input, where the shared second switch device includes a terminal coupled to a terminal of each of the first switch devices.

The first and second compare circuits may include corresponding first and second pull-down circuits. The first and second pull-down circuits may each include a corresponding first switch device controllable by the respective stored bit. The first and second pull-down circuits may further include a shared second switch device controllable by the reference input, where the shared second switch device includes a terminal coupled to a terminal of each of the first switch devices.

As further disclosed herein, a processor-based system may include an array of content addressable memory (CAM) cells, each including a bit cell and a compare circuit as described in one or more examples herein.

The processor-based system may include a processor to search the array of CAM cells for a reference word of multiple reference bits.

The processor-based system may include a communication system to communicate with a network. The communication system may include a wireless communication system.

The processor-based system may include communication infrastructure to communicate amongst the processor, the communication system, and a user interface system.

The processor-based system may include a housing.
The processor-based system may include a battery.
The processor, the communication system, the battery, and at least a portion of the user interface system may be positioned within the housing.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the example embodiments disclosed herein.

What is claimed is:

1. An apparatus, comprising a first content addressable memory (CAM) cell that includes a first compare circuit implemented to receive a reference bit and operate under control of the reference bit, and a stored bit and a corresponding stored complementary bit stored in the CAM cell, to selectively:
provide the reference bit to an output node;
pull-up the output node; or
pull-down the output node,
wherein the compare circuit includes
a pass circuit to receive the reference bit and selectively provide the reference bit to the output node under control of the stored complementary bits, wherein the pass circuit is implemented to provide the reference bit to the output node when the stored bit is 0 and the stored complementary bit is 1;

a pull-up circuit to selectively pull-up the output node under control of the reference bit and the stored complementary bit, wherein the pull-up circuit is implemented to pull-up the output node when the reference bit is 0 and the stored complementary bit is 0; and a pull-down circuit to selectively pull-down the output node under control of the reference bit and the stored bit, wherein the pull-down circuit is implemented to pull-down the output node when the reference bit is 1 and the stored bit is 1.

2. The apparatus of claim 1, wherein the compare circuit is controllable by respective logic levels of the reference bit and the stored complementary bits so as to produce a logic level at the output node that is equal to a result of an XOR of the logic value of the reference bit and the logic value of the stored bit.

3. An apparatus, comprising a first content addressable memory (CAM) cell that includes a first compare circuit implemented to receive a reference bit and operate under control of the reference bit, and a stored bit and a corresponding stored complementary bit stored in the CAM cell, to selectively:

provide the reference bit to an output node;
pull-up the output node; or
pull-down the output node, wherein the compare circuit includes a pass circuit to receive the reference bit and selectively provide the reference bit to the output node under control of the stored complementary bits, wherein the pass circuit is coupled to an input node of the compare circuit that receives the reference bit;

a pull-up circuit to selectively pull-up the output node under control of the reference bit and the stored complementary bit, wherein the pull-up circuit is coupled to the output node and a voltage supply node; and a pull-down circuit to selectively pull-down the output node under control of the reference bit and the stored bit, wherein the pull-down circuit is connected to the output node and a voltage reference node.

4. The apparatus of claim 1, further including a second CAM cell that includes a second compare circuit, the second compare circuit including:

a pass circuit to receive the reference bit and selectively provide the reference bit to an output node under control of a stored bit and a corresponding stored complementary bit stored in the second CAM cell;

a pull-up circuit to selectively pull-up the output node under control of the reference bit and the stored complementary bit of the second CAM cell; and a pull-down circuit to selectively pull-down the output node under control of the reference bit and the stored bit of the second CAM cell.

5. The apparatus of claim 4, further comprising an inverter to receive an inverted reference bit and output the reference bit.

6. The apparatus of claim 4, wherein the first CAM cell pull-up circuit and the second CAM cell pull-up circuit:

each includes a respective first switch device controllable by the respective stored complementary bit; and include a shared second switch device controllable by the reference bit, wherein the shared second switch device includes a terminal coupled to a terminal of the respective first switch devices.

7. The apparatus of claim 4, wherein the first CAM cell pull-down circuit and the second CAM cell pull-down circuit:

each includes a respective first switch device controllable by the respective stored bit; and include a shared second switch device controllable by the reference bit, wherein the shared second switch device includes a terminal coupled to a terminal of the respective first switch devices.

8. The apparatus of claim 1, further comprising:

a processor and memory including the first CAM cell;

a communication system to communicate between a network and one or more of the processor and memory, and a user interface system; and a housing to house the processor and memory, the communication system, and the user interface system.

9. An apparatus, comprising a first content addressable memory (CAM) cell that includes a first compare circuit, the compare circuit including:

pass means for receiving a reference bit and selectively providing the reference bit to an output node under control of a stored bit and a corresponding stored complementary bit stored in the CAM cell, wherein the pass means includes means for providing the reference bit to the output node when the stored bit is 0 and the stored complementary bit is 1;

pull-up means for selectively pulling-up the output node under control of the reference bit and the stored complementary bit, wherein the pull-up means includes means for pulling-up the output node when the reference bit is 0 and the stored complementary bit is 0; and pull-down means for selectively pulling-down the output node under control of the reference bit and the stored bit, wherein the pull-down means includes means for pulling-down the output node when the reference bit is 1 and the stored bit is 1.

10. The apparatus of claim 9, wherein the compare means includes means, controllable by respective logic levels of the reference bit and the stored complementary bits, for producing a logic level at the output node that is equal to a result of an XOR of the logic value of the reference bit and the logic value of the stored bit.

11. The apparatus of claim 9, further including a second CAM cell that includes a second compare circuit, the second compare circuit including:

pass means for receiving the reference bit and selectively providing the reference bit to an output node under control of a stored bit and a corresponding stored complementary bit of the second CAM cell;

pull-up means for selectively pulling-up the output node under control of the reference bit and the stored complementary bit of the second CAM cell; and pull-down means for selectively pulling-down the output node under control of the reference bit and the stored bit of the second CAM cell.

12. The apparatus of claim 11, further comprising inverter means for inverting an inverted reference bit and outputting the reference bit.

13. The apparatus of claim 11, wherein the first CAM cell pull-up means and the second CAM cell pull-up means:

each includes a respective first switch device controllable by the respective stored complementary bit; and include a shared second switch device controllable by the reference bit, wherein the shared second switch device includes a terminal coupled to a terminal of the respective first switch devices.

14. The apparatus of claim 11, wherein the first CAM cell pull-down means and the second CAM cell pull-down means:
- each includes a respective first switch device controllable by the respective stored bit; and
- include a shared second switch device controllable by the reference bit, wherein the shared second switch device includes a terminal coupled to a terminal of the respective first switch devices.

* * * * *